(12) United States Patent
Mitani et al.

(10) Patent No.: US 11,171,231 B2
(45) Date of Patent: Nov. 9, 2021

(54) SILICON CARBIDE SEMICONDUCTOR DEVICE AND METHOD FOR MANUFACTURING THE SAME

(71) Applicant: DENSO CORPORATION, Kariya (JP)

(72) Inventors: Shuhei Mitani, Kariya (JP); Masahiro Kumita, Toyota (JP); Narumasa Soejima, Nagakute (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 16/804,565

(22) Filed: Feb. 28, 2020

(65) Prior Publication Data

US 2020/0203526 A1 Jun. 25, 2020

Related U.S. Application Data

(63) Continuation of application No. PCT/JP2018/034870, filed on Sep. 20, 2018.

(30) Foreign Application Priority Data

Sep. 27, 2017 (JP) .............................. JP2017-186917

(51) Int. Cl.
*H01L 29/78* (2006.01)
*H01L 29/16* (2006.01)
(Continued)

(52) U.S. Cl.
CPC ...... *H01L 29/7813* (2013.01); *H01L 29/1608* (2013.01); *H01L 29/4236* (2013.01); *H01L 29/66734* (2013.01)

(58) Field of Classification Search
CPC ......... H01L 29/10; H01L 29/12; H01L 29/16; H01L 29/66; H01L 29/78; H01L 29/1095; H01L 29/1608; H01L 29/423; H01L 29/4236; H01L 29/4238; H01L 29/7813; H01L 29/66068; H01L 29/66734;
(Continued)

(56) References Cited

U.S. PATENT DOCUMENTS

2007/0132012 A1 6/2007 Saito
2009/0200559 A1* 8/2009 Suzuki ................ H01L 29/7811
257/77

(Continued)

FOREIGN PATENT DOCUMENTS

JP 2013-105841 A 5/2013
JP 2016-119392 A 6/2016

*Primary Examiner* — Chuong A Luu
(74) *Attorney, Agent, or Firm* — Posz Law Group, PLC (57) ABSTRACT

A silicon carbide semiconductor device includes a semiconductor element with a MOS structure having: a substrate; a drift layer on the substrate; a base region on the drift layer; a source region on the base region; a trench gate structure having a gate insulation film and a gate electrode in a gate trench disposed from a surface of the source region to be deeper than the base region; an interlayer insulation film covering the gate electrode and the gate insulation film; a source electrode on the interlayer insulation film, the source region and the base region; and a drain electrode. The semiconductor element flows a current when a gate voltage is applied to the gate electrode and a channel region is provided in a portion of the base region in contact with the trench gate structure.

4 Claims, 11 Drawing Sheets

(51) Int. Cl.
*H01L 29/423* (2006.01)
*H01L 29/66* (2006.01)

(58) Field of Classification Search
CPC ................ H01L 21/316; H01L 29/417; H01L 29/41725; H01L 29/41791; H01L 29/66636; H01L 29/66643; H01L 29/66613; H01L 29/66628; H01L 29/0843; H01L 29/0891; H01L 29/7825; H01L 29/7839; H01L 29/42336; H01L 29/42352; H01L 29/806; H01L 21/823418; H01L 21/823425; H01L 21/823814
USPC ........................................................ 257/330
See application file for complete search history.

(56) References Cited

U.S. PATENT DOCUMENTS

| | | |
|---|---|---|
| 2010/0327313 A1 | 12/2010 | Nakamura |
| 2013/0292738 A1 | 11/2013 | Nakamura |
| 2014/0042523 A1 | 2/2014 | Yamagami et al. |
| 2015/0235866 A1* | 8/2015 | Nakamura .......... H01L 29/8611 257/77 |

* cited by examiner

SILICON CARBIDE SEMICONDUCTOR DEVICE AND METHOD FOR MANUFACTURING THE SAME

CROSS REFERENCE TO RELATED APPLICATION

The present application is a continuation application of International Patent Application No. PCT/JP2018/034870 filed on Sep. 20, 2018, which designated the U.S. and claims the benefit of priority from Japanese Patent Application No. 2017-186917 filed on Sep. 27, 2017. The entire disclosures of all of the above applications are incorporated herein by reference.

TECHNICAL FIELD

The present disclosure relates to a SiC semiconductor device having a semiconductor element with a trench gate type MOS structure made of silicon carbide (hereinafter referred to as SiC) and a method of manufacturing the same.

BACKGROUND

Conventionally, MOSFETs using SiC have been developed as power devices. In a MOSFET, an interlayer insulation film is formed in order to insulate and separate between a gate electrode and a source electrode. For example, after forming the gate electrode, PSG (Phosphorous Silicate Glass) or BPSG (Boro-phospho silicate glass) is formed as an interlayer insulation film so as to cover the gate electrode. Subsequently, a contact hole for a source contact is formed in the interlayer insulation film by photolithography and etching steps. Then, after the interlayer insulation film is rounded by annealing process, an electrode material is formed on the interlayer insulation film, and the electrode material is patterned to form a source electrode. Thus, a structure in which the gate electrode and the source electrode are insulated and separated from each other with the interlayer insulation film.

SUMMARY

According to an example embodiment, a silicon carbide semiconductor device includes a semiconductor element with a MOS structure having: a substrate; a drift layer on the substrate; a base region on the drift layer; a source region on the base region; a trench gate structure having a gate insulation film and a gate electrode in a gate trench disposed from a surface of the source region to be deeper than the base region; an interlayer insulation film covering the gate electrode and the gate insulation film; a source electrode on the interlayer insulation film, the source region and the base region; and a drain electrode. The semiconductor element flows a current when a gate voltage is applied to the gate electrode and a channel region is provided in a portion of the base region in contact with the trench gate structure.

BRIEF DESCRIPTION OF THE DRAWINGS

The objects, features and advantages of the present disclosure will become more apparent from the following detailed description made with reference to the accompanying drawings.

DETAILED DESCRIPTION

In a conceivable semiconductor device, due to a mask misalignment at the time of forming a contact hole in the interlayer insulation film, the insulation separation between the gate electrode and the source electrode may not be ensured, so that a difficulty of causing a gate-source leakage may arise. In addition, there may be a difficulty that even though the source electrode contacts one side of the gate electrode, the source electrode may not contact the other side. These difficulties may be more likely to occur as the elements are further microfabricated, so that the accuracy requirement may exceed the allowable limit of the alignment of the stepper, and mass production of SiC semiconductor devices may be difficult.

In addition, since the interlayer insulation film has a shape protruding from the surface of the SiC, cracks may occur in the interlayer insulation film due to stress caused by a temperature change or the like, and the cracks may be a factor of causing a leakage between the gate and the source.

A SiC semiconductor device is provided to have a structure capable of accurately obtaining a contact of a source electrode while ensuring insulation isolation between a gate and a source, and to provide a method of manufacturing the same.

According to an example embodiment, a SiC semiconductor device includes: a substrate made of SiC having a first conductivity type or a second conductivity type; a drift layer made of SiC having the first conductivity type with an impurity concentration lower than the substrate and disposed on the substrate; a base region made of SiC having the second conductivity type and disposed on the drift layer; a source region made of SiC having the first conductivity type with a first conductivity type impurity concentration higher than the drift layer and disposed on the base region; a trench gate structure having a gate insulation film covering an inner wall of a gate trench and a gate electrode with an impurity doped therein disposed on the gate insulation film, the gate insulation film and the gate electrode being arranged in the gate trench disposed from a surface of the source region to be deeper than the base region; an interlayer insulation film covering the gate electrode and the gate insulation film, disposed in the gate trench, and made of a thermal oxidation film with an impurity which is a same as the impurity doped in the gate electrode; a source electrode disposed on a surface of the interlayer insulation film, a surface of the source region and a surface of the base region and electrically connected to the source region and the base region; and a drain electrode disposed on a back side of the substrate.

In this manner, the gate electrode and the source electrode are insulated by the thermal oxidation film formed by thermally oxidizing a part of the gate electrode. In addition, since the thermal oxidation film formed by thermally oxidizing a part of the gate electrode does not protrude so much from the SiC surface, a crack generated by a stress due to a temperature change or the like hardly occurs. Therefore, it is possible to ensure insulation separation between the gate and the source. Further, since the thermal oxidation film obtained by thermally oxidizing a part of the gate electrode insulates between the gate and the source, an etch back process is performed so that an interlayer insulation film is not formed on a portion, which functions as a semiconductor element, on the surface of the source region and the surface of the base region. Therefore, it is possible to accurately contact the source electrode on both sides of the gate electrode.

Here, a parenthesized reference symbol attached to each constituent element or the like shows an example of the correspondence of the constituent element or the like and a specific constituent element or the like described in an embodiment to be described later.

Hereinafter, embodiments of the present disclosure will be described with reference to the drawings. In the following embodiments, the same or equivalent parts are denoted by the same reference numerals as each other, and explanations will be provided with the same reference numerals.

First Embodiment

Figure 1:
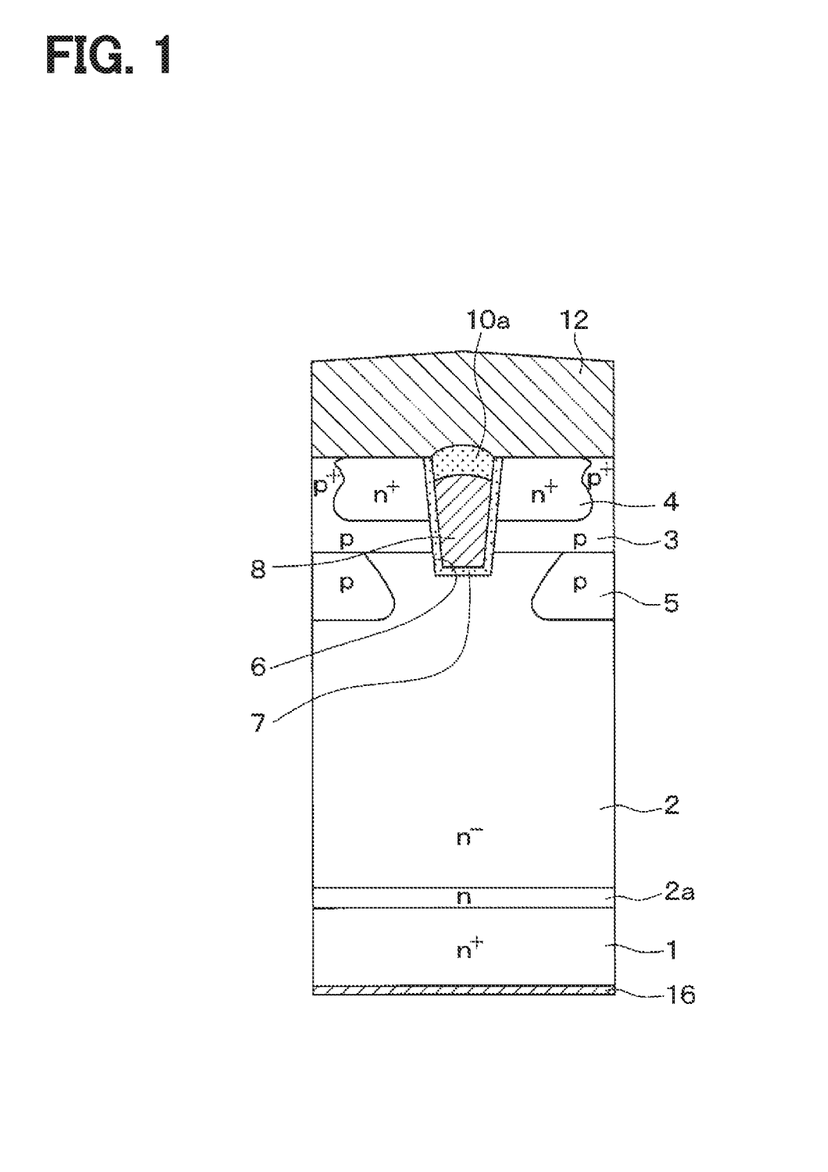
FIG. 1 is a cross-sectional view of a semiconductor device according to a first embodiment.
Figure 2:
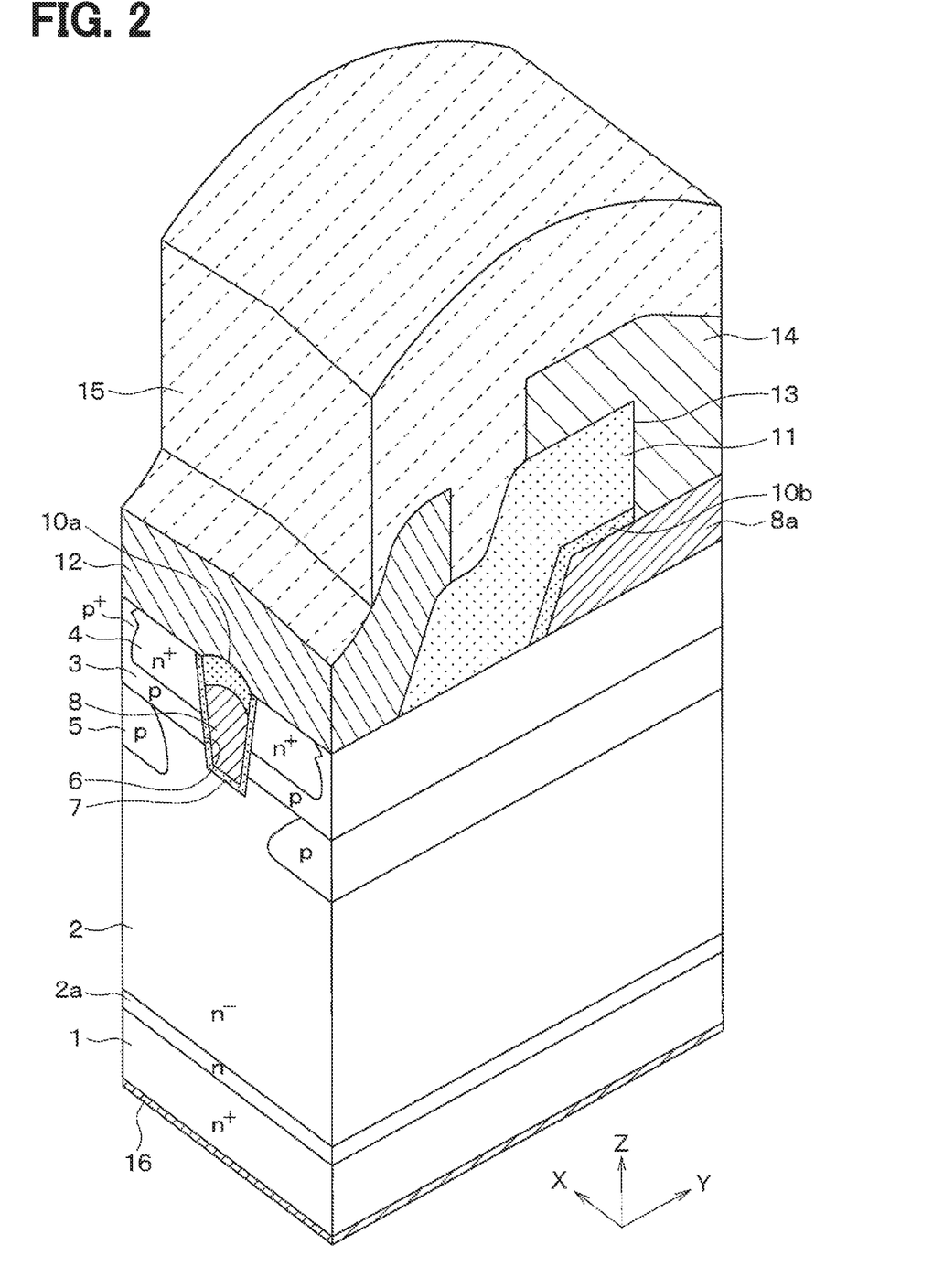
FIG. 2 is a perspective cross-sectional view of the semiconductor device shown in FIG. 1.

A first embodiment will be described. In a semiconductor device according to the present embodiment, a vertical MOSFET is formed as a semiconductor element having a MOS structure as shown in FIGS. 1 and 2. The vertical MOSFET is formed in a cell region of the semiconductor device, and the semiconductor device is configured by forming an outer peripheral withstand voltage structure so as to surround the cell region. Here, only the gate lead portion in the vertical type MOSFET and the vertical type MOSFET are shown. In the following description, in the vertical MOSFET, the right-left direction in FIG. 1 and the X direction in FIG. 2 are defined as the width direction, the perpendicular direction on the drawing in FIG. 1 and the Y direction in FIG. 2 are defined as a length direction, and the up-down direction in FIG. 1 and the z direction in FIG. 2 are defined as the thickness direction or the depth direction.

In the semiconductor device, an $n^+$ type substrate 1 made of SiC is used as a semiconductor substrate. In the case of the present embodiment, the length direction coincides with the off-set direction. As the $n^+$ type substrate 1, an off-set substrate having a (0001)-Si plane as the surface with a predetermined off-set angle is used, and an off-set direction is, for example, <11-20> direction. The n type impurity concentration of the $n^+$ type substrate 1 is, for example, $1.0 \times 10^{19}/cm^3$.

On the main surface of the $n^+$ type substrate 1, an $n^-$ type drift layer 2 made of SiC, a p type base region 3, and an $n^+$ type source region 4 are epitaxially grown in an order.

The $n^-$ type drift layer 2 has, for example, an n type impurity concentration of 0.5 to $2.0 \times 10^{16}/cm^3$ and a thickness of 5 μm to 14 μm. Note that a buffer layer 2a obtained by partially increasing a concentration in the $n^-$ type drift layer 2 may be formed at a boundary between the $n^-$ type drift layer 2 and the $n^+$ type substrate 1 if necessary.

The p type base region 3 is a portion where a channel region is to be formed, has a p type impurity concentration of, for example, about $2.0 \times 10^{17}/cm^3$ and a thickness of 0.5 μm to 2 μm. In the case of the present embodiment, the surface portion of the p type base region 3 is a contact region having a high p type impurity concentration.

The $n^+$ type source region 4 has a higher impurity concentration than that of the n-type drift layer 2, and has the n type impurity concentration in the surface portion of, for example, $2.5 \times 10^{18}$ to $1.0 \times 10^{19}/cm^3$, and a thickness of about 0.5 to 2 μm.

Further, a p type deep layer 5 is formed at a surface portion of the n-type drift layer 2, that is, below the p type base region 3. The p type deep layer 5 has a p type impurity concentration higher than the impurity concentration of the p type base region 3. Multiple p type deep layers 5 are disposed at regular intervals and spaced apart from each other without intersecting with each other so that an upper surface layout thereof has a stripe shape. For example, each of the p type deep layers 5 has a p type impurity concentration of $1.0 \times 10^{17}/cm^3$ to $1.0 \times 10^{19}/cm^3$ and a width of 0.7 μm. In addition, each of the p type deep layers 5 has a depth of 0.4 μm or more and is formed to a position deeper than a trench gate structure described later so as to restrict an electric field from entering into the trench gate structure.

In the present embodiment, the p type deep layers 5 are formed only in the surface portions of the $n^-$ type drift layer 2. Alternatively, the p type deep layers 5 may also be formed to penetrate through the $n^+$ type source region 4 and the p type base region 3 and reach the $n^-$ type drift layer 2. For example, trenches may be formed from the surface of the $n^+$ type source region 4, and the p type deep layers 5 may be formed so as to fill the trenches.

In addition, a gate trench 6, for example, having a width of 0.8 μm and a depth deeper by 0.2 to 0.4 μm than the total film thickness of the p type base region 3 and the $n^+$ type source region 4 is formed so as to penetrate through the p type base region 3 and the $n^+$ type source region 4 and reach the n type drift layer 2. The above described p type base region 3 and $n^+$ type source region 4 are arranged so as to be in contact with the side surface of the gate trench 6. The gate trench 6 is formed in a linear layout in which the width direction, the depth direction, and the thickness direction of the vertical MOSFET are defined as the width direction, the longitudinal direction, and the depth direction, respectively. In addition, although only one gate trench 6 is shown in FIGS. 1 and 2, multiple gate trenches 6 are disposed at regular intervals in the right-left direction of the drawing in FIG. 1 so as to be sandwiched between the p type deep layers 5, and formed in a stripe shape.

A portion of the p type base region 3 located on a side surface of the gate trench 6 provides a channel region that connects the $n^+$ type source region 4 and the $n^-$ type drift layer 2 when the vertical MOSFET is operated. On the inner wall of the gate trench 6 including the channel region, a gate insulation film 7 is formed. A gate electrode 8 made of doped polysilicon is formed on a surface of the gate insulation film 7, and an inside of the gate trench 6 is filled with the gate insulation film 7 and the gate electrode 8. The trench gate structure is configured as described above. The gate insulation film 7 may be formed up to the outside of the gate trench 6. Alternatively, it may be preferable to form the film 7 only in the gate trench 6.

On the gate electrode 8, a thermal oxide film 10a corresponding to a first interlayer insulation film formed by thermally oxidizing the surface of the gate electrode 8 is arranged. The thermal oxide film 10a is made of a silicon oxide film formed by a thermal oxidation process, and includes therein an impurity for providing a dopant with respect to a semiconductor. This impurity is the same as that included in the gate electrode 8, and is, for example, phosphorus (P) or boron (B). Either phosphorus or boron may be included as an impurity, or both may be included as an impurity in the thermal oxide film 10a.

The thermal oxide film 10a is formed in the gate trench 6, is thicker than the portion of the gate insulation film 7 on the inner wall of the gate trench 6 where the channel region is formed, and is thinner than 500 nm. By controlling the thickness of the thermal oxide film 10a thicker than that of the gate insulation film 7, the insulation separation between the gate electrode 8 and a source electrode 12 described later can be surely completed. Further, by controlling the thermal oxide film 10a thinner than 500 nm, the gate electrode 8 can be accurately arranged on the side opposite to the n$^+$ type source region 4 via the gate insulation film 7 interposed therebetween. It is not necessary to form the n$^+$ type source region 4 at a position deeper than necessary.

The thermal oxide film 10a has a height of ±100 nm with respect to the surface of the n$^+$ type source region 4 outside the gate trench 6. Specifically, the thermal oxide film 10a has the same height as the surface of the n$^+$ type source region 4, or is in a state that the film 10a penetrates inside of the gate trench 6, or is in a state that the film 10a protrudes toward the outside of the gate trench 6. When the surface of the thermal oxide film 10a penetrates inside of the gate trench 6 from the surface of the n$^+$ type source region 4, the amount of penetration is 100 nm or less, and when the surface of the film 10a protrudes outside the gate trench 6, the protrusion amount is 100 nm or less. The height of the thermal oxide film 10a is defined by minus when the surface of the thermal oxide film 10a enters the inside of the gate trench 6 from the surface of the n$^+$ type source region 4, and is defined by plus when the surface of the film 10a protrudes outside the surface of the n$^+$ type source region 4.

Further, the thermal oxide film 10a does not protrude outside the gate trench 6 in the width direction of the gate trench 6, and is terminated inside of the gate trench 6 in the width direction thereof. Therefore, the contact region of n$^+$ type source region 4 and p type base region 3 is exposed from thermal oxide film 10a.

In the cell region, a plurality of trench gate structures are arranged in a stripe pattern. Then, as shown in FIG. 2, a gate lead portion 8a, in which the doped polysilicon for constituting the gate electrode 8 is left, is formed so as to connect the top ends of the trench gate structures in the longitudinal direction, or so as to connect the intermediate positions of the trench gate structures in the longitudinal direction (not shown). The gate lead portion 8a is formed so as to protrude above the gate electrode 8, that is, protrude from the surface of the SiC such as the n$^+$ type source region 4. The thermal oxide film 10b is also partially disposed on gate lead portion 8a. In this portion, the thermal oxide film 10b is formed above the SiC surface such as n$^+$ type source region 4.

In the vicinity of the gate lead portion 8a, an interlayer insulation film 11 corresponding to the second interlayer insulation film, including the gate insulation film 7 and the thermal oxide films 10a and 10b, is formed on the contact region of the p type base region 3 and the surface of the n$^+$ type source region 4. The interlayer insulation film 11 is formed by, for example, BPSG. When the interlayer insulation film 11 is made of BPSG, the thickness of the interlayer insulation film 11 is, for example, 600 nm.

A part of the interlayer insulation film 11 is removed at a position other than on or near the gate lead portion 8a in the cell region where the vertical MOSFET is formed. Therefore, the gate insulation film 7, the thermal oxide film 10a, the contact region of the p type base region 3, and the n$^+$ type source region 4 are exposed from the interlayer insulation film 11 at a position other than the gate lead portion 8a. The source electrode 12 is formed at the exposed position, and is electrically connected to the contact region of the p type base region 3 and the n$^+$ type source region 4.

Further, the interlayer insulation film 11 is also partially removed on the gate lead portion 8a. In this portion, the thermal oxide film 10b is also removed, and the contact hole 13 is formed. The gate wiring layer 14 is formed at the position where the contact hole 13 is formed, so that the gate wiring layer 14 is connected to the gate lead portion 8a.

The source electrode 12 and the gate wiring layer 14 are made of multiple metals, for example, such as Ni/Al. At least a portion of the metals being in contact with n type SiC, specifically, the n$^+$ type source region 4, is made of a metal capable of ohmic contact with the n type SiC. In addition, at least a portion in contact with p type SiC among the plurality of metals, specifically, in contact with the p type deep layer 5, is made of a metal capable of ohmic contact with the p type SiC. The source electrode 12 and the gate wiring layer 14 are arranged separately from each other, and are electrically insulated by the thermal oxide films 10a and 10b and the interlayer insulation film 11.

The surfaces of the source electrode 12, the gate wiring layer 14, and the interlayer insulation film 11 are covered and protected by the passivation film 15. Although not shown, the source electrode 12 and the gate wiring layer 14 are exposed by partially removing the passivation film 15, so that they are connected to a source pad and a gate pad for external connection.

Further, a drain electrode 16 electrically connected to the n$^+$ type substrate 1 is formed on a back surface of the n$^+$ type substrate 1. The structure described above configures an inverted vertical MOSFET that has an n channel type and the trench gate structure. A cell region is configured by arranging multiple cells of the vertical MOSFETS described above. The semiconductor device is formed by configuring an outer peripheral withstand voltage structure with a guard ring (not shown) or the like so as to surround the cell region in which the vertical MOSFETs described above are formed.

The SiC semiconductor device having the vertical MOSFETS configured as described above is operated, for example, by applying a gate voltage Vg of 20 V to the gate electrode 8 in a state where a source voltage Vs is 0 V and a drain voltage Vd is 1 V to 1.5 V. That is, when the gate voltage Vg is applied to the vertical MOSFET, the channel region is formed at the portion of the p type base region 3 being in contact with the gate trench 6, and an electric current flows between the drain and the source.

In order to perform such an operation accurately, it is a point such that the insulation and separation between the gate and the source is ensured by the thermal oxide film 10a so that the gate-source leakage does not occur, and the contact of the source electrode 12 is accurately performed. On the other hand, in the semiconductor device of the present embodiment, the thermal oxide film 10a is disposed in the gate trench 6. For this reason, it is possible to ensure the insulation and separation between the gate and the source by the thermal oxide film 10a. In addition, the thermal oxide film 10a is arranged in the gate trench 6 so as not to protrude from the gate trench 6 in the width direction of the gate trench 6. As a result, the source electrode 12 is properly in contact with the contact region of the p type base region 3 and the n+ type source region 4. For this reason, the contact of the source electrode 12 can be performed accurately.

As described above, it is possible to provide a SiC semiconductor device having a structure in which the source electrode 12 can be accurately contacted while ensuring the insulation and separation between the gate and the source by the thermal oxide film 10a.

In a region operated as a MOSFET, the thermal oxide film 10a does not have a shape protruding from the SiC surface, or even if the film 10a protrudes, the amount of protrusion is small. Therefore, cracks in the thermal oxide film 10a due to a stress caused by a temperature change or the like is suppressed, and it is possible to suppress the occurrence of gate-source leakage.

Next, a manufacturing method of the semiconductor device having the vertical type MOSFET according to the present embodiment will be described with reference to FIG. 3A to FIG. 3H.

Figure 3A:
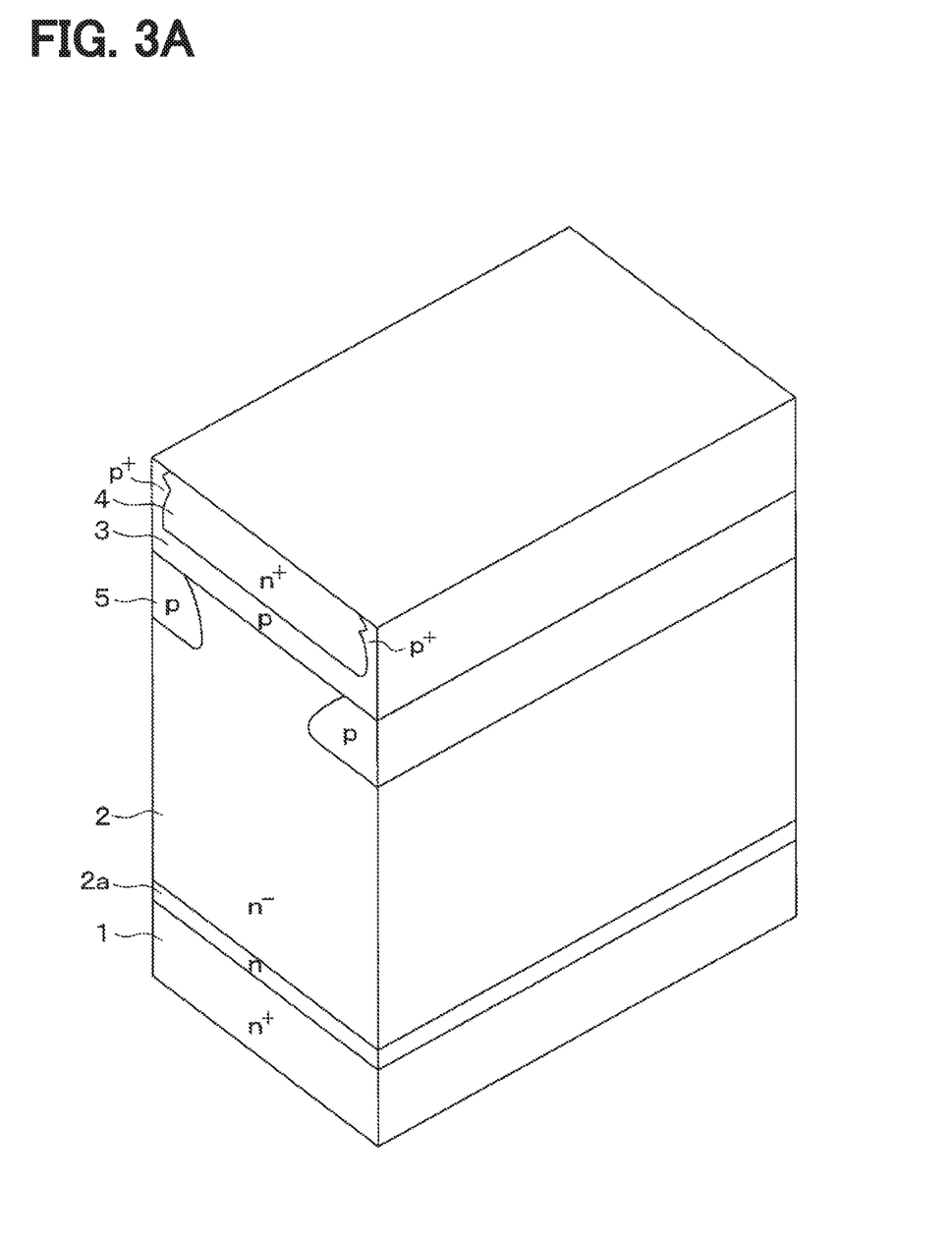
FIG. 3A is a cross-sectional view showing a manufacturing process of the semiconductor device shown in FIG. 1.

[Process Shown in FIG. 3A]

First, a wafer-shaped n type substrate 1 is prepared as a semiconductor substrate. Then, an n− type drift layer 2 made of SiC is formed on the main surface of the n+ type substrate 1 using a chemical vapor deposition (hereinafter, referred to as a CVD) device or the like. At this time, if necessary, a buffer layer 2a formed by increasing the concentration of the n− type drift layer 2 partially may be formed. Thereafter, although not shown, after arranging a mask having an opening at a portion where the p type deep layer 5 is to be formed, the p type deep layer 5 is formed by an ion implantation of the p type impurity.

Then, after removing the mask, the p type base region 3 and the n+ type source region 4 are formed above the n− type drift layer 2 on which the p type deep layer 5 is formed. For example, after the p type base region 3 is epitaxially grown, the n+ type source region 4 is formed by an ion implantation of the n type impurity. Alternatively, after the p type base region 3 and the n+ type source region 4 are epitaxially grown, a p type impurity is ion-implanted to form the contact region of the p type base region 3. Through these steps, the p type base region 3 and n+ type source region 4 are formed.

Figure 3B:
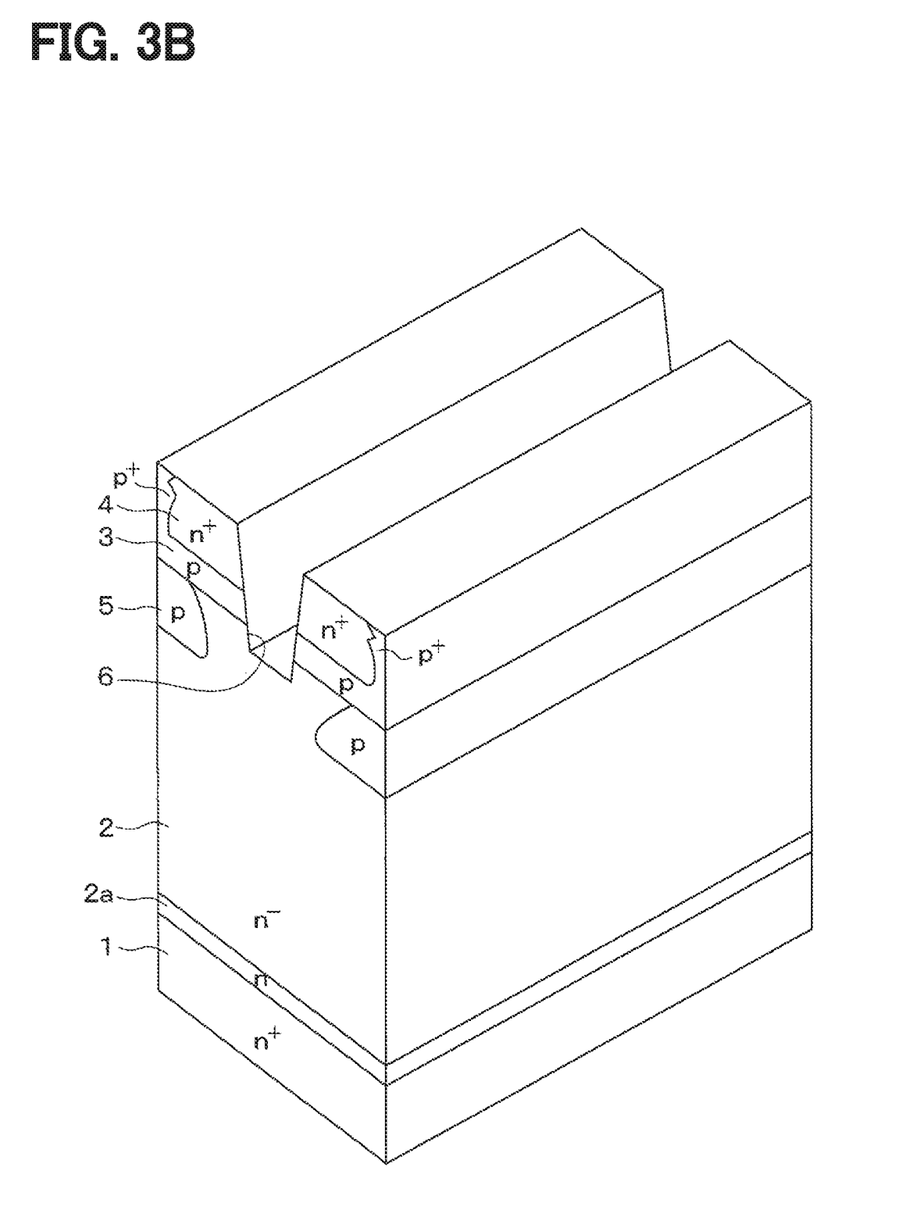
FIG. 3B is a cross-sectional view showing a manufacturing process of the semiconductor device continued from FIG. 3A.

[Process Shown in FIG. 3B]

Next, a mask (not shown) is arranged on the surfaces of the p type base region 3 and the n+ type source region 4, and a portion of the mask where the trench gate structure is to be formed is opened. Then, anisotropic etching such as reactive ion etching (RIE) is performed using the mask to form the gate trench 6. For example, etching is performed so that the depth of the gate trench 6 is set to be deeper by 0.2 μm to 0.4 μm than the total film thickness of the p type base region 3 and the n+ type source region 4. As a result, the amount of protrusion of the gate trench 6 from a bottom portion of the p type base region 3 is set to be 0.2 to 0.4 μm.

Figure 3C:
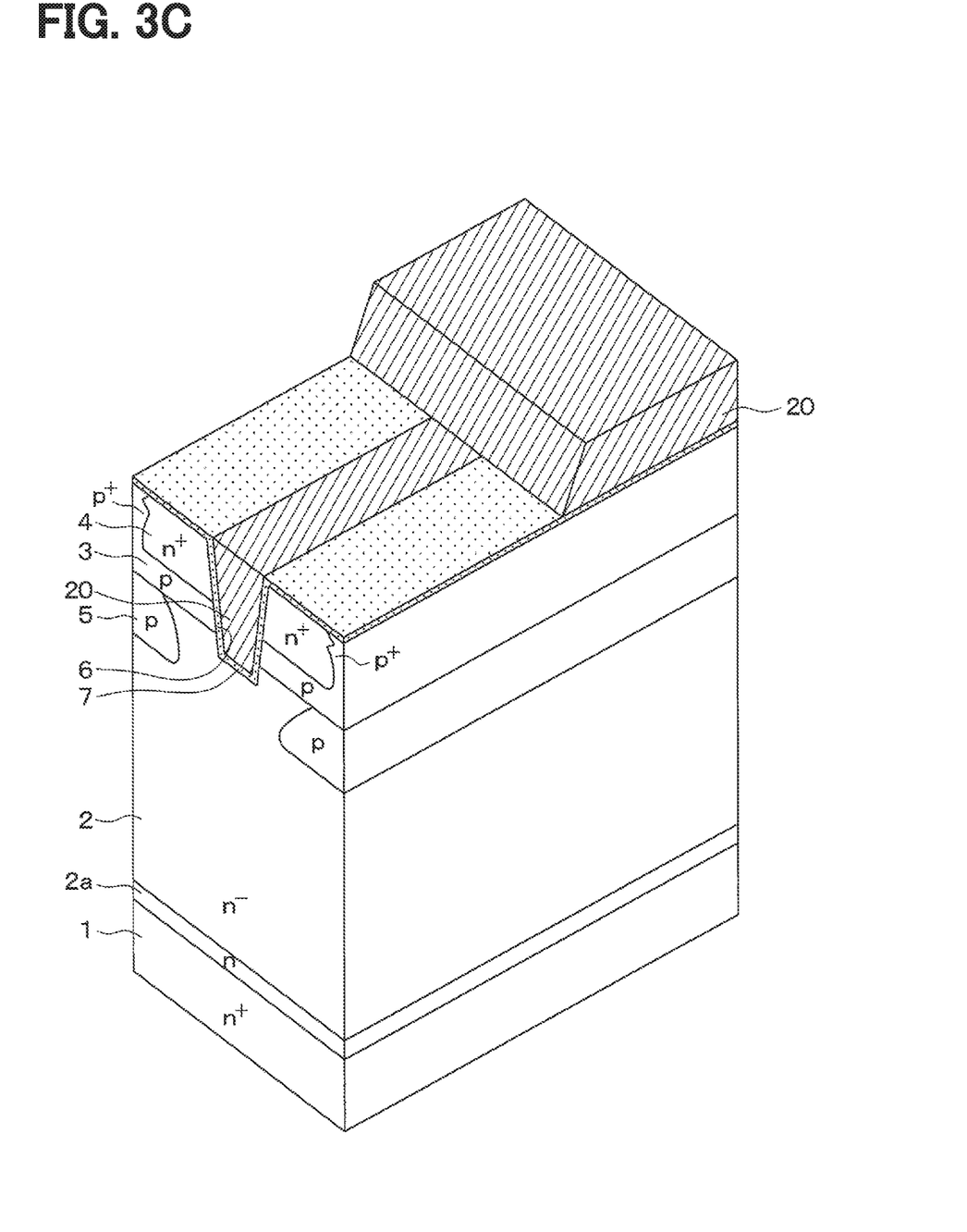
FIG. 3C is a cross-sectional view showing a manufacturing process of the semiconductor device continued from FIG. 3B.

[Process Shown in FIG. 3C]

After the mask is removed, the gate insulation film 7 is formed by performing thermal oxidation, for example, so that the gate insulation film 7 covers the inner wall surface of the gate trench 6 and the surface of the n+ type source region 4. Then, in order to form the gate electrode 8 and the gate lead portion 8a, for example, polysilicon 20 doped with an n type impurity is deposited and then etched back. At this time, a mask is arranged so as to cover a portion to be the gate lead portion 8a, and the polysilicon 20 is etched back. As a result, the polysilicon 20 is left in the gate trench 6, and the polysilicon 20 is left so as to protrude above the SiC surface at the position where the gate lead portion 8a is to be formed. In addition, the polysilicon 20 is removed at a position other than the inside of the gate trench 6 and a portion where the gate lead portion 8a is to be formed. Then, the mask used at the time of the etch back is removed.

Figure 3D:
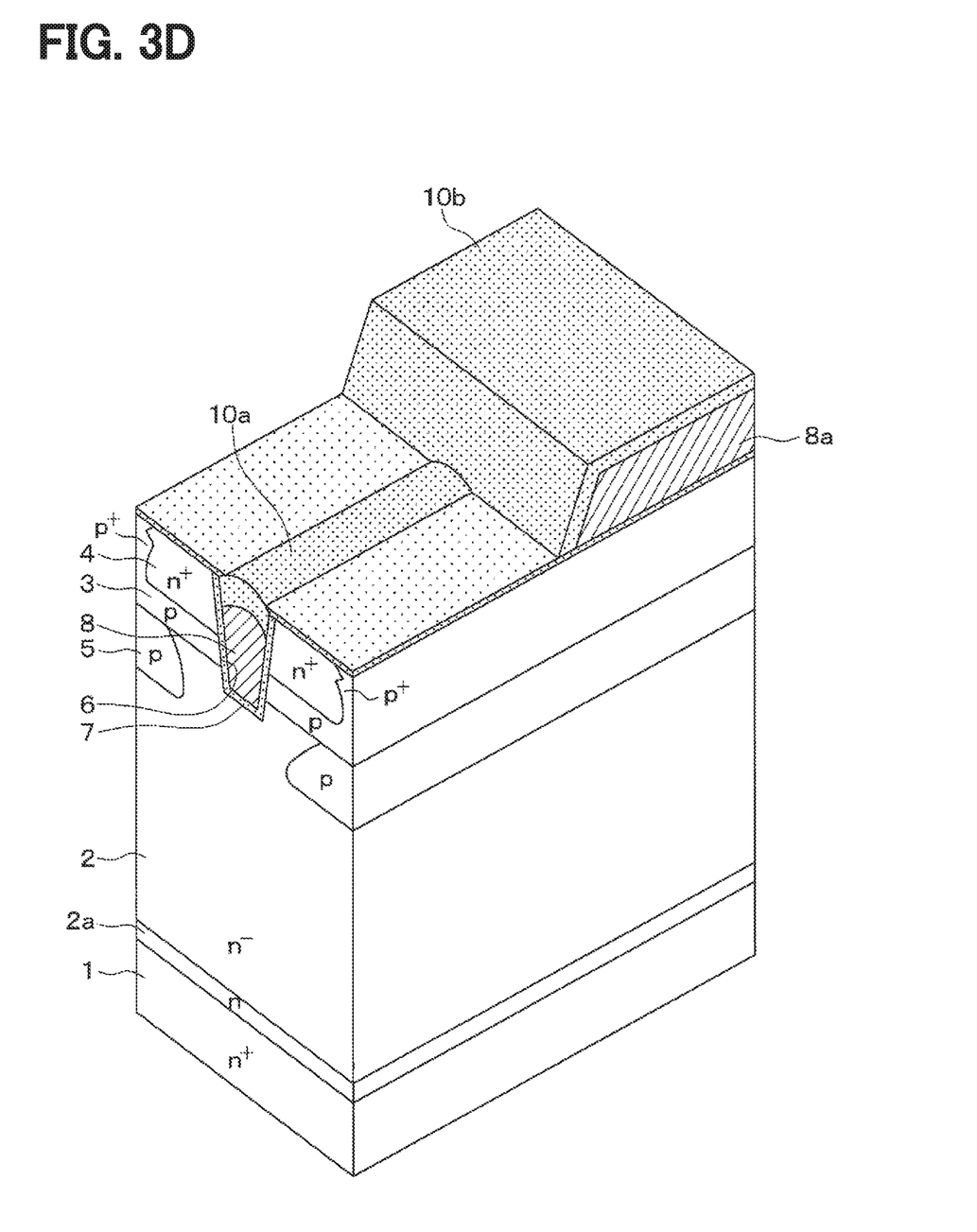
FIG. 3D is a cross-sectional view showing a manufacturing process of the semiconductor device continued from FIG. 3C.

[Process Shown in FIG. 3D]

By performing the heat treatment, the surface of the polysilicon 20 is thermally oxidized. The heat treatment is performed, for example, by wet oxidation at 1050° C. for 30 minutes. As a result, in the gate trench 6, the polysilicon 20 is thermally oxidized to form a thermal oxide film 10a, and the remaining polysilicon 20 forms the gate electrode 8. On the surface of the polysilicon 20 at the position where the gate lead portion 8a is to be formed, the thermal oxide film 10b is formed, and the remaining polysilicon 20 forms the gate lead portion 8a. Although the thickness of the thermal oxide films 10a and 10b may be arbitrary, the height of the thermal oxide film 10a with respect to the surface of the n+ type source region 4 outside the gate trench 6 is set to be ±100 nm after the etch-back process is performed in a step shown in FIG. 3F later described.

Thus, the thermal oxide films 10a and 10b are formed. Since the thermal oxide films 10a and 10b formed in this manner are obtained by thermally oxidizing the polysilicon 20 doped with the impurities, the thermal oxide films 10a and 10b include impurities serving as dopants for the semiconductor.

When the polysilicon 20 is thermally oxidized, the height of the thermal oxide films 10a and 10b becomes higher than the polysilicon 20 before the thermal oxidation due to volume expansion. Note that the heat treatment is performed at a temperature at which the polysilicon 20 is thermally oxidized but SiC is not substantially oxidized. By doing so, the thermal oxide films 10a and 10b are formed while the thickness of the gate insulation film 7 is not substantially increased.

Figure 3E:
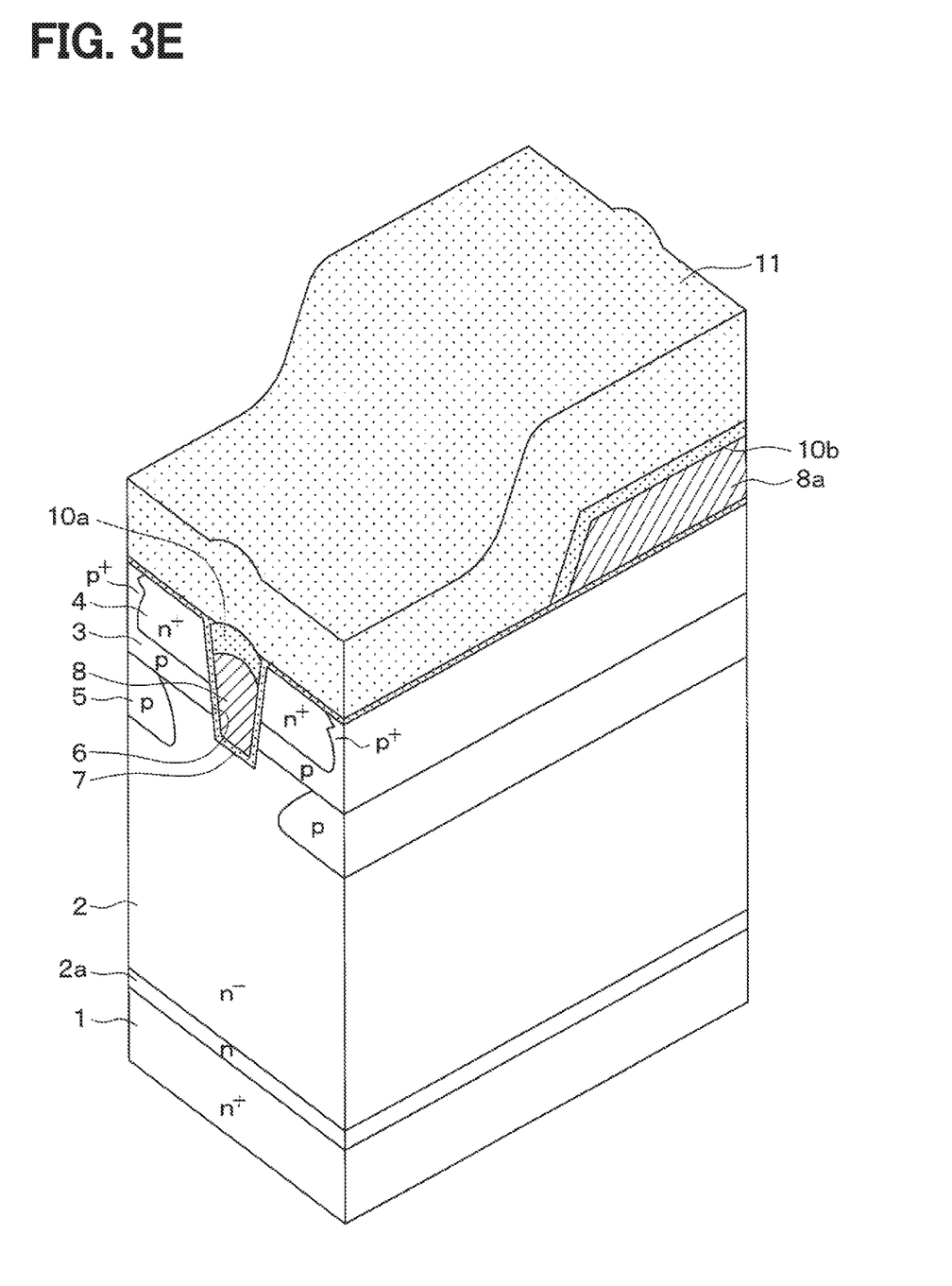
FIG. 3E is a cross-sectional view showing a manufacturing process of the semiconductor device continued from FIG. 3D.

[Process Shown in FIG. 3E]

After the interlayer insulation film 11 made of BPSG or the like is deposited on the surfaces of the thermal oxide films 10a and 10b and the gate insulation film 7 by using a CVD device or the like, a reflow process is performed. At this time, the thickness of the interlayer insulation film 11 may be arbitrary, but the thickness of the film 11 is larger than the thermal oxide films 10a and 10b.

Figure 3F:
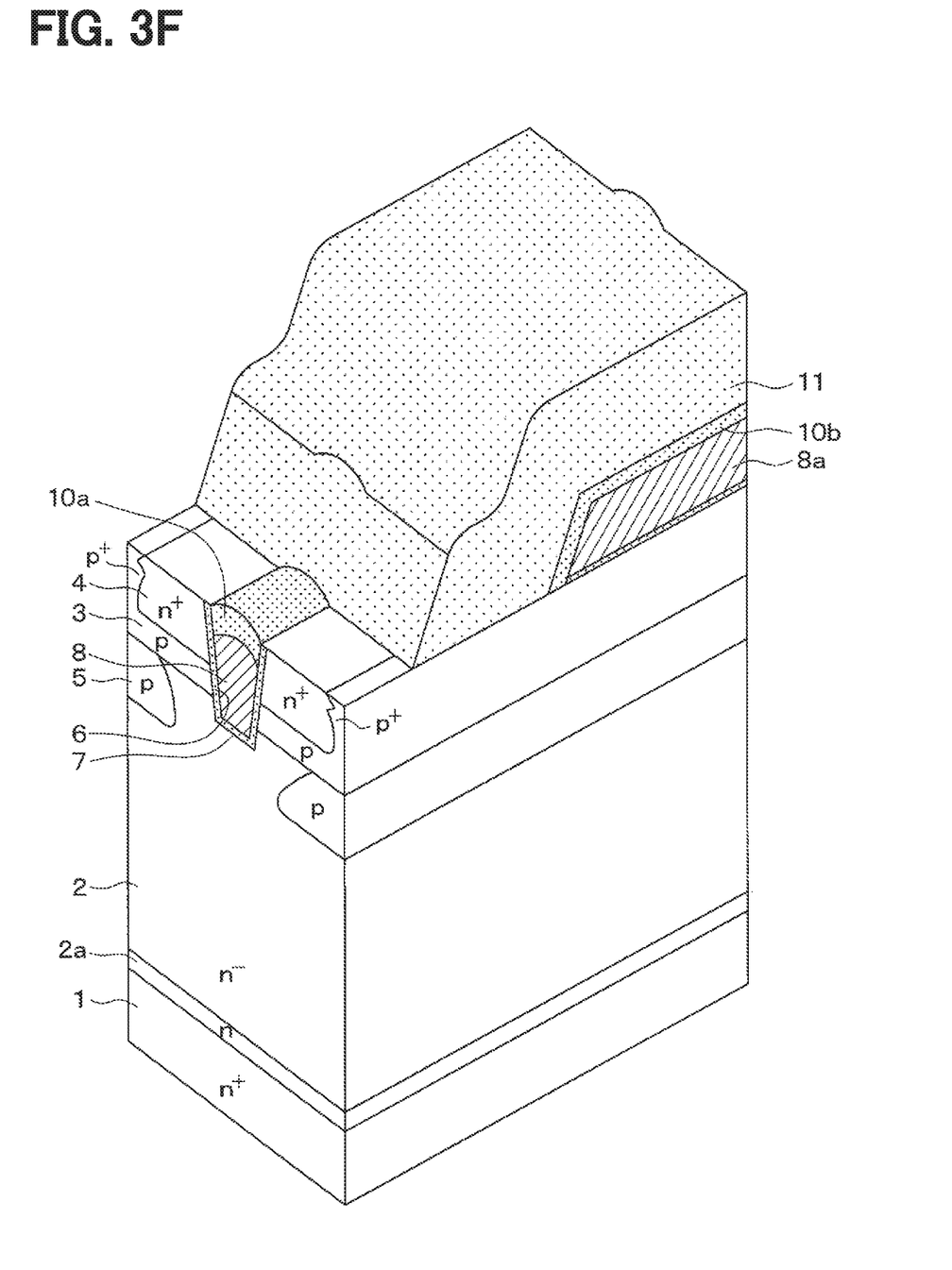
FIG. 3F is a cross-sectional view showing a manufacturing process of the semiconductor device continued from FIG. 3E.

[Process Shown in FIG. 3F]

After arranging a mask (not shown) covering a portion of the interlayer insulation film 11 corresponding to the gate lead portion 8a, a portion of the interlayer insulation film 11 and a portion of the gate insulation film 7 located outside the gate trench 6 and a portion of the thermal oxide film 10a protruding from gate trench 6 are etched back. Specifically, the etch back process is performed by chemical dry etching (hereinafter, referred to as CDE).

At this time, the thermal oxide film 10a formed by thermal oxidation is a denser film than the interlayer insulation film 11 formed by the CVD method. Thus, the etching rate of the thermal oxide film 10a at the time of etch-back process is slower than the interlayer insulation film 11. That is, the etch back process is performed under a condition that the interlayer insulation film 11 is easily etched, and the thermal oxide film 10a is not easily etched. In particular, the chemical etching such as CDE is preferable because the thermal oxide film 10a is not so etched. Here, the chemical dry etching is used as the chemical etching method. Alternatively, the wet etching may be used.

This makes it possible to completely remove the interlayer insulation film 11 while leaving the thermal oxide film 10a in the gate trench 6. Also, a portion of the gate insulation film 7 formed to be thinner than the thermal oxide film 10a located outside the gate trench 6 is completely or almost completely removed, and the n+ type source region 4 and the contact region of the p type base 3 are exposed. In this manner, the thermal oxide film 10a functioning as an interlayer insulation film for insulating between the gate and the source remains in the gate trench 6 in a self-aligned manner, and the film 10a is not formed outside the gate trench 6 in the width direction.

Figure 3G:
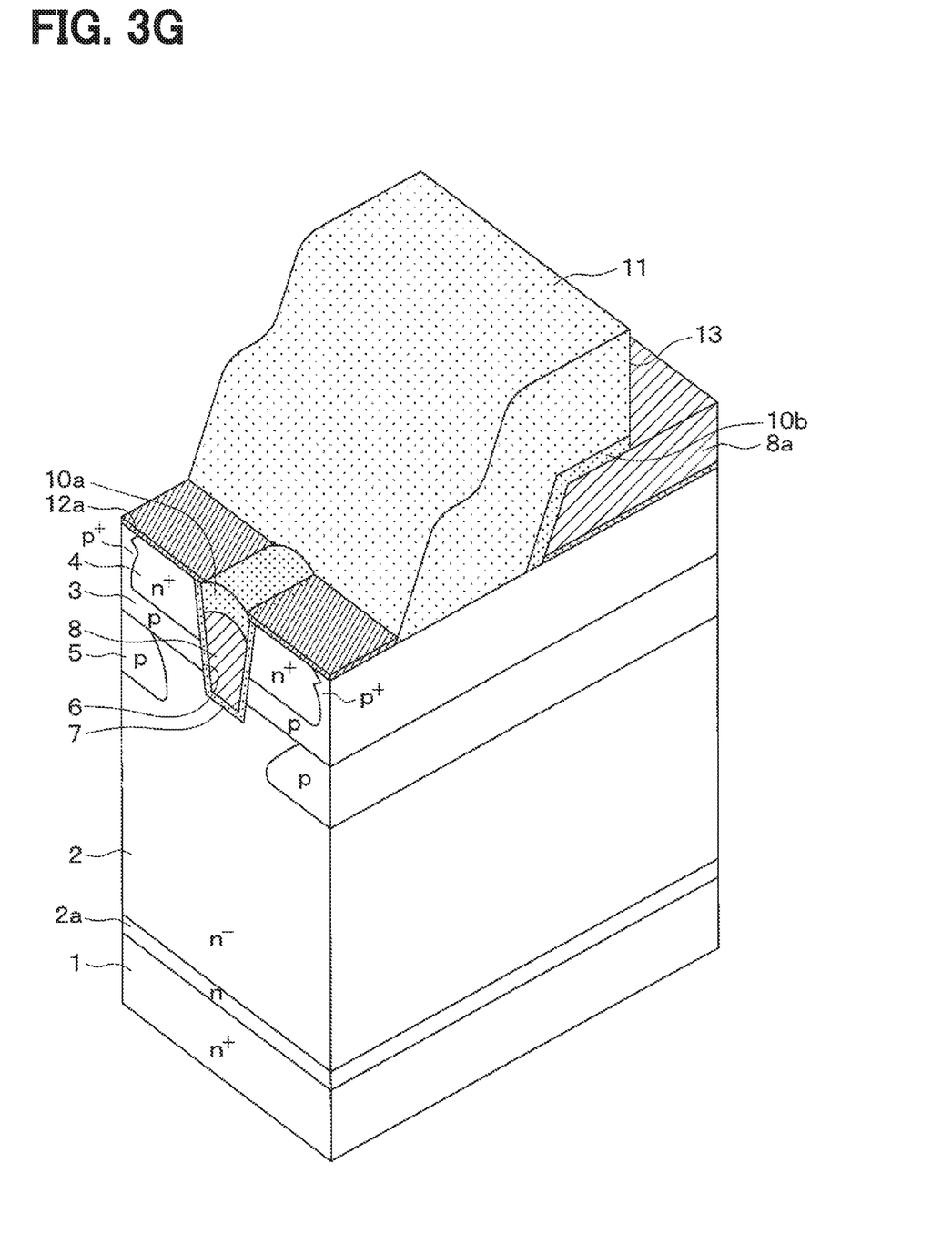
FIG. 3G is a cross-sectional view showing a manufacturing process of the semiconductor device continued from FIG. 3F.

[Process Shown in FIG. 3G]

As the source electrode 12, a contact metal layer 12a made of, for example, Ni is deposited. Thereafter, heat treatment is performed if necessary. Thus, for example, when Ni is used as the metal layer 12a, a Ni silicide layer can be formed.

Further, after arranging a mask (not shown), a part of the mask where the contact hole 13 is to be formed is opened, and the contact hole 13 is formed by etching the interlayer insulation film 11 and the thermal oxide film 10b.

Figure 3H:
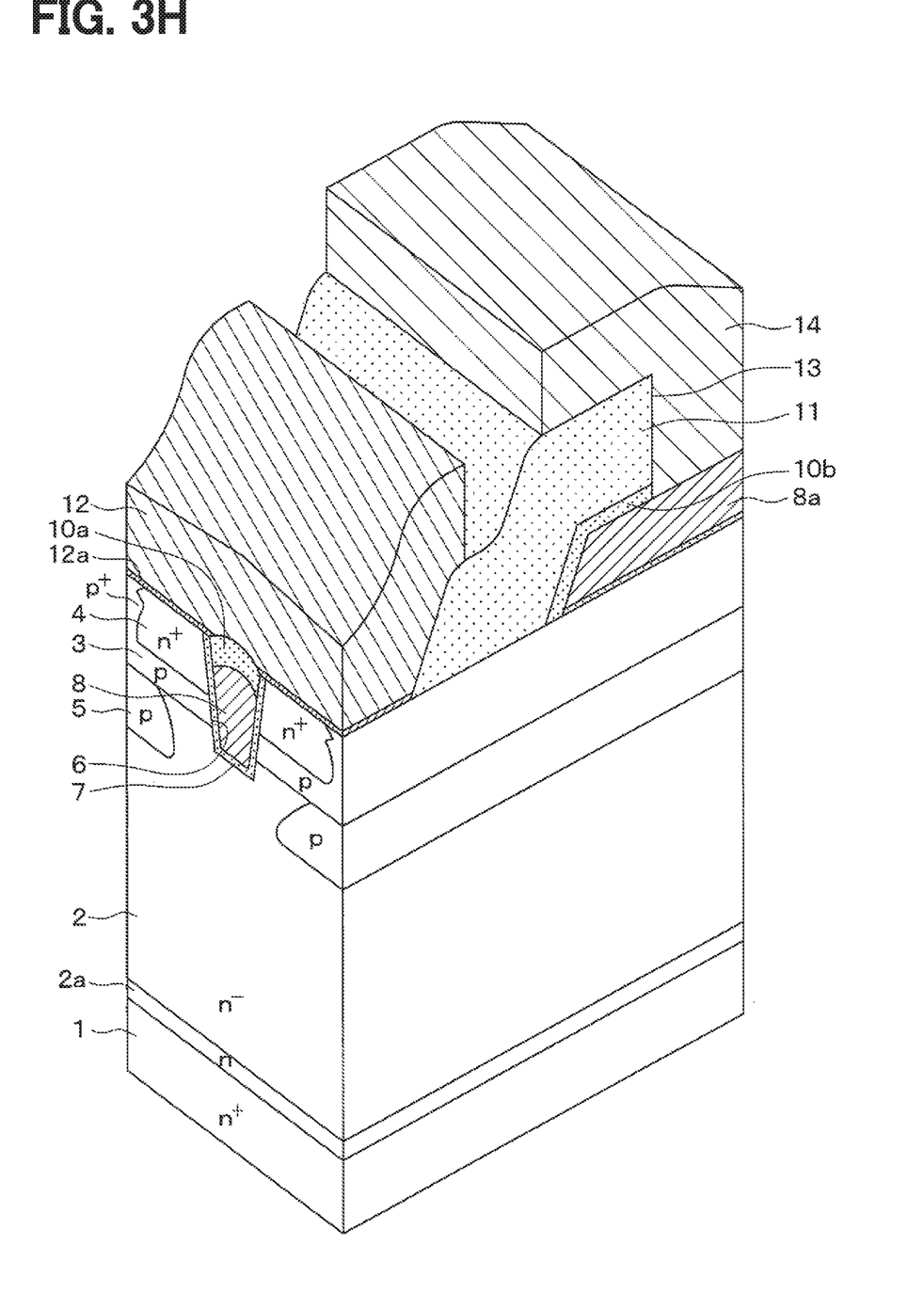
FIG. 3H is a cross-sectional view showing a manufacturing process of the semiconductor device continued from FIG. 3G.

[Step Shown in FIG. 3H]

A metal layer is formed on the metal layer 12a and the interlayer insulation film 11 including the inside of the contact hole 13, and is patterned to form the source electrode 12 and the gate wiring layer 14.

Figure 3I:
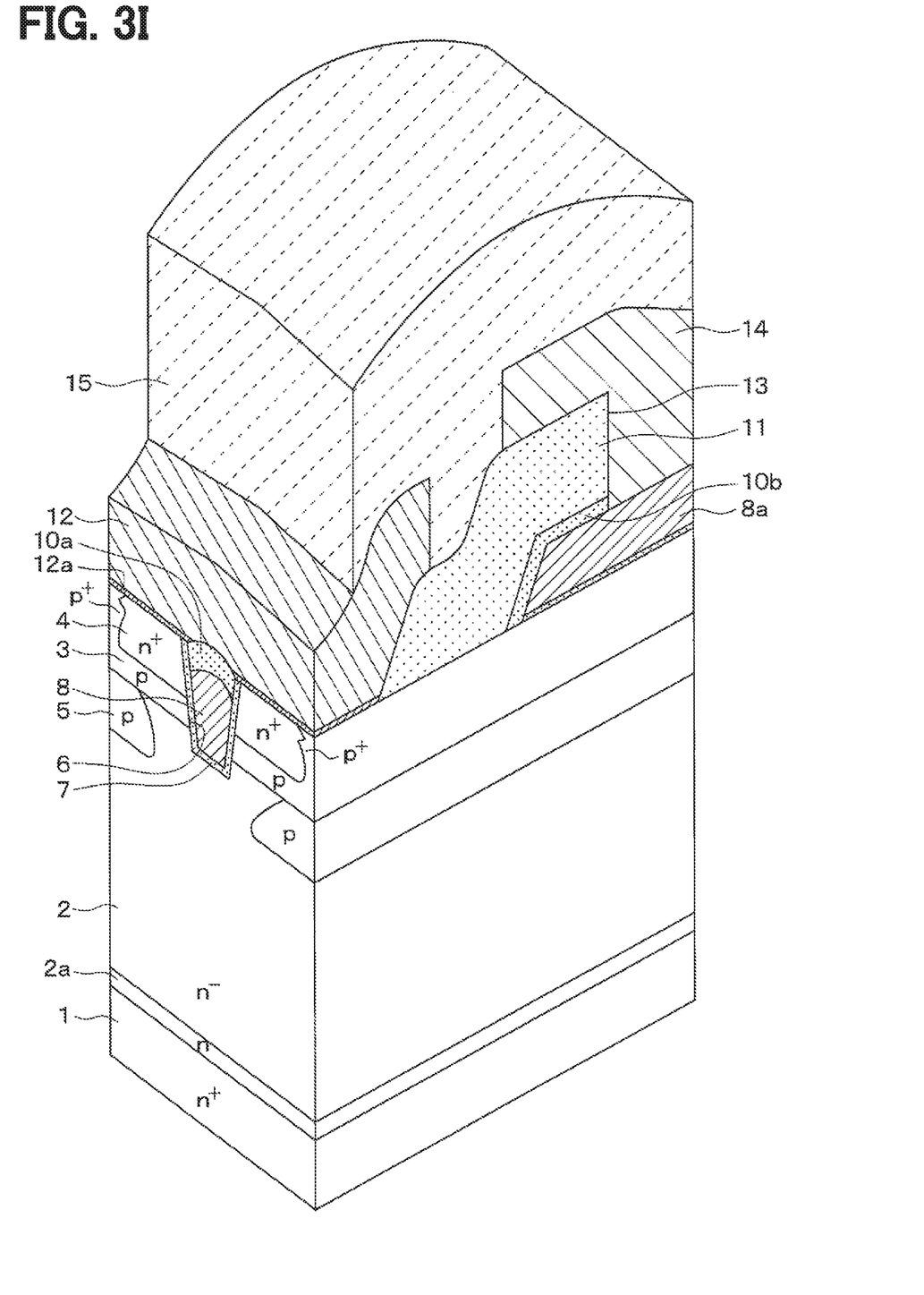
FIG. 3I is a cross-sectional view showing a manufacturing process of the semiconductor device continued from FIG. 3H.

[Step Shown in FIG. 3I]

After a passivation film 15 is formed so as to cover the source electrode 12, the gate wiring layer 14, and the like, a desired portion of the source electrode 12 and the gate wiring layer 14 is exposed by a patterning process.

Although the subsequent steps are not shown, the semiconductor device having the vertical MOSFET according to the present embodiment shown in FIG. 1 is completed by performing steps such as a step for forming a drain electrode 16 on the back side of the n+ type substrate 1.

As described above, in the semiconductor device of the present embodiment, the gate electrode 8 and the source electrode 12 can be insulated by the thermal oxide film 10a formed by thermally oxidizing a part of the gate electrode 8. In addition, since the thermal oxidation film 10a formed by thermally oxidizing a part of the gate electrode 8 does not protrude so much from the SiC surface, a crack generated by a stress due to a temperature change or the like hardly occurs. Therefore, it is possible to ensure insulation separation between the gate and the source.

The interlayer insulation film 11 is removed from above the n+ type source region 4 and the contact region of the p type base region 3 by the etch back process. Therefore, it is possible to accurately contact the source electrode 12 on both sides of the gate electrode 8.

Therefore, it is possible to provide a SiC semiconductor device having a structure capable of accurately making contact with the source electrode 12 while ensuring the insulation isolation between the gate and the source. Further, when the thermal oxide film 10a, formed by thermally oxidizing a part of the gate electrode 8, insulates between the gate and the source, it is possible to accurately secure the gate-source insulation even when the micro-fabrication proceeds.

In this manner, the thermal oxide film 10a functioning as an interlayer insulation film for insulating between the gate and the source remains in the gate trench 6 in a self-aligned manner, and the film 10a is not formed outside the gate trench 6 in the width direction. For this reason, mass productivity of the SiC semiconductor device can be ensured.

Other Embodiments

Although the present disclosure is made based on the embodiments described above, the present disclosure is not limited to such embodiments but includes various changes and modifications which are within equivalent ranges. In addition, various combinations and forms, and further, other combinations and forms including only one element, or more or less than these elements are also within the scope and the scope of the present disclosure.

For example, in the above-described embodiment, an n channel-type vertical MOSFET in which the first conductivity type is the n type and the second conductivity type is the p type has been described as an example. Alternatively, the conductivity type of each element may be reversed so as to form a p channel-type vertical MOSFET. In the above description, a vertical MOSFET has been described as an example of a semiconductor element having a MOS structure. Alternatively, the present disclosure may be applied to an IGBT having a similar MOS structure. In the case of an n-channel type IGBT, only the conductivity type of the n+ type substrate 1 is changed from the n type to the p type with respect to the embodiments described above, and other structures and manufacturing methods are the similar to those in the embodiments described above.

It should be noted that when the crystal orientation is to be indicated, a bar (-) should originally be attached above the desired number, but since there are restrictions on the representation based on the electronic filing application, the bar is attached before the desired number in the present specification.

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

What is claimed is:

1. A silicon carbide semiconductor device comprising:
a semiconductor element with a MOS structure, wherein:
the semiconductor element includes:
a substrate made of silicon carbide having a first conductivity type or a second conductivity type;
a drift layer arranged on the substrate and made of silicon carbide having the first conductivity type with an impurity concentration lower than the substrate;
a base region made of silicon carbide having the second conductivity type and arranged on the drift layer;
a source region made of silicon carbide having the first conductivity type with a first conductivity type impurity concentration higher than the drift layer and arranged on the base region;
a trench gate structure having a gate insulation film covering an inner wall of a gate trench and a gate electrode, in which an impurity is doped, arranged on the gate insulation film, the gate insulation film and the gate electrode being arranged in the gate trench disposed from a surface of the source region to be deeper than the base region;

an interlayer insulation film covering the gate electrode and the gate insulation film, arranged in the gate trench, and made of a thermal oxide film including an impurity same as the impurity doped in the gate electrode;

a source electrode arranged on a surface of the interlayer insulation film, a surface of the source region and a surface of the base region, and electrically connected to the source region and the base region; and a drain electrode arranged on a back side of the substrate;

the semiconductor element flows a current when a gate voltage is applied to the gate electrode and a channel region is provided in a portion of the base region in contact with the trench gate structure;

the interlayer insulation film is thicker than a portion of the gate insulation film on an inner wall of the gate trench where the channel region is provided; and wherein the interlayer insulation film does not protrude outside the gate trench in a width direction of the gate trench, and is terminated inside of the gate trench in the width direction; and wherein the source region and a contact region of the base region is exposed from the thermal oxide film.

2. The silicon carbide semiconductor device according to claim 1, wherein:

the interlayer insulation film has a height, which is equal to the surface of the source region outside the gate trench, is concaved inside the gate trench from the surface of the source region by 100 nm or less, or protrudes outside the gate trench from the surface of the source region by 100 nm or less.

3. The silicon carbide semiconductor device according to claim 1, wherein:

the interlayer insulation film is thinner than 500 nm.

4. The silicon carbide semiconductor device according to claim 1, wherein:

the interlayer insulation film in a region for operating as the semiconductor element is terminated inside along a width direction of the gate trench.

\* \* \* \* \*